（12）United States Patent
van Lammeren et al.

(10) Patent No.: US 8,680,868 B2
(45) Date of Patent: Mar. 25, 2014

(54) SPECTROSCOPIC BATTERY-CELL IMPEDANCE MEASUREMENT ARRANGEMENT

(75) Inventors: Johannes Petrus Maria van Lammeren, Beuningen (NL); Matheus Johannus Gerardus Lammers, Nederweert (NL)

(73) Assignee: NXP B.V., Eindhoven (NL)

( * ) Notice: Subject to any disclaimer, the term of this patent is extended or adjusted under 35 U.S.C. 154(b) by 350 days.

(21) Appl. No.: 13/282,126

(22) Filed: Oct. 26, 2011

(65) Prior Publication Data

US 2012/0105070 A1    May 3, 2012

(30) Foreign Application Priority Data

Oct. 28, 2010   (EP) .................................. 10189208

(51) Int. Cl.
*G01N 27/416*   (2006.01)
*H02J 7/00*   (2006.01)

(52) U.S. Cl.
USPC ........... 324/426; 324/430; 324/436; 320/132; 320/152

(58) Field of Classification Search
CPC .................................................. G01R 31/3648
USPC ....................................................... 324/426
See application file for complete search history.

(56) References Cited

U.S. PATENT DOCUMENTS

| 2005/0218915 | A1* | 10/2005 | Tinnemeyer | 324/709 |
| 2011/0215760 | A1 | 9/2011 | van Lammeren | |

FOREIGN PATENT DOCUMENTS

| DE | 10 2009 002 465 A1 | 10/2010 | | |
| DE | 10 2009 002 468 A1 | 10/2010 | | |
| EP | 0 544 121 A1 | 6/1993 | | |
| EP | DE0544121 A1 * | 6/1993 | ............ | G01R 31/36 |
| WO | 92/04626 A1 | 3/1992 | | |

OTHER PUBLICATIONS

Jespersen, J. L. et al. "Capacity Measurements of Li-Ion Batteries using AC Impedance Spectroscopy", World Electric Vehicle Journal, vol. 3, ISSN 2032-6653, 7 pgs. (May 2009).
U.S. Appl. No. 13/164,998, filed Jun. 21, 2011.
Extended European Search Report for European Patent Appln. No. 10189208.1 (Apr. 14, 2011).

* cited by examiner

*Primary Examiner* — Edward Tso
*Assistant Examiner* — Ahmed Omar

(57) ABSTRACT

A battery cell measurement system comprising a signal generator coupled to a pulse density modulation circuit generating a control signal which drives a switch connected between a first terminal of a battery cell and a first terminal of a bleeding impedance, a second terminal of the bleeding impedance being coupled to a second battery cell terminal. The first terminal is coupled to a first terminal of a second switch. The second terminal is coupled to a first terminal of a third switch. A second terminal of the second switch and second terminal of the third switch are coupled and are further coupled to a low-pass filter. A signal generated by the low-pass filter is inputted into an analog to digital converter, which provides a signal representative of either a signal across the bleeding impedance, or a signal between the battery cell terminals.

6 Claims, 6 Drawing Sheets

SPECTROSCOPIC BATTERY-CELL IMPEDANCE MEASUREMENT ARRANGEMENT

This application claims the priority under 35 U.S.C. §119 of European patent application no. 10189208.1, filed on Oct. 28, 2010, the contents of which are incorporated by reference herein.

FIELD OF THE INVENTION

The present patent application describes a spectroscopic battery-cell impedance measurement arrangement.

In systems with rechargeable batteries it is important to know the impedance of the battery cell(s). Knowing the impedances of the cell(s), and the way they change in time provide for accurately estimate the State of Charge (SoC) and the State of Health (SoH) of the battery pack as it is described in "Capacity measurement of Li-Ion batteries using AC impedance spectroscopy", by J. L. Jespersen et al., World Electric Vehicle Journal Vol. 3.

It also makes it possible to apply optimum charge and discharge strategies that can maximise both the calendar life, the cycle life, and the energy storage capacity of the battery pack.

In this description we shall use the following definitions, which are illustrated in FIG. 8. FIG. 8. shows a simplified block diagram of a battery pack with components as defined below.

cell or battery cell: the basic component. Voltage: typically 2.5-4.2V, dependent on chemistry and SoC section: group of cells that share cell-balancing and measurement components.
Voltage: typically 5-17V, depending on the number of cells in the section, the cell chemistry and SoC module: group of sections. Voltage: usually chosen to be a "safe voltage", i.e. up to 60V slice: group of series-connected modules that generate the same voltage as the total battery pack. Voltage: depending on the application somewhere in the range of 100V to 600V pack or battery pack: group of parallel-connected slices that make up the total battery as used in the application. The parallel connection increases the energy content and power capabilities of the battery pack, but not its voltage. In many applications the battery pack consists of just one single slice. Voltage: depending on the application somewhere in the range of 100V to 600V.

FIG. 1. shows a simplified model of a battery cell. The capacitor models the chemical charge storage. The three impedances model different effects which cause the battery cell voltage to change when current is flowing through them. The first impedance $Z_{m,c}$ models the resistance of the materials in the battery cell and the inductance caused by its construction e.g. wounded or flat electrodes. The second impedance, $Z_{kin}$, models the kinetic effects. The third, $Z_{dif}$, models the diffusion effects. The first impedance is much like a resistance in series with an inductance, the other two are non-linear time-variant impedances. The active surface area of the electrodes decreases as the battery ages. This manifests itself as an increase of especially $Z_{m,c}$ is therefore a good indicator of the SoH of a battery cell.

The standard way to obtain information about these impedances is to measure simultaneously the battery cell voltage and current. This is repeated regularly, e.g. at 1 second intervals. The measurement results are then used to fit a model. The model outputs the SoC and SoH. This way of working means that all parameters of the battery cell, including the three resistances, are measured indirectly. If it were possible to measure one or more of the resistances directly, the accuracy with which the model can estimate the other impedances and parameters can be improved. This is helpful in improving the accuracy of the SoC and SoH indications.

One way to measure the impedance fairly directly is to use electroscopy. Electroscopy is a technique that determines the impedance of the battery at different frequencies. The results of the electroscopy measurements are usually represented in a Nyquist plot: a diagram that shows the real and imaginary part of the impedance on the X and Y-axes. The measurement is repeated at different frequencies and the result is shown in FIG. 2. The curve clearly shows three parts. The high-frequency part i.e. kHz range is indicative for the impedance $Z_{m,c}$. The low-frequency part i.e. Hz range is indicative for the "kinetic" impedance and the very-low frequency part i.e. mHz is indicative for the "diffusion" impedance.

FIG. 3 shows the basic spectroscopy measurement setup. A source drives a current through the battery pack. In present-day systems the source is usually a voltage source, but it may also be a current source. The voltage/current levels are chosen low, so the battery can be regarded as a linear system in the measurement point. The current is converted into a voltage by a resistor connected in series with the battery. Band-pass filters eliminate unwanted signals e.g. noise and distortion before they can reach the amplitude-and-phase meters. The battery voltage and the voltage across the conversion resistor are measured with identical amplitude-and-phase meters. All meters and band-pass filters are identical to ensure identical gain and identical delay time in these circuits. From the amplitude and phase of the measured voltages we can easily find the real and imaginary parts of the battery's impedance.

$$|Z_{bat}| = \frac{V_{bat}}{V_{conv}} R_{conv}$$

$$Re_{bat} = |Z_{bat}| \cdot \cos(\phi_{bat})$$

$$Im_{bat} = |Z_{bat}| \cdot \sin(\phi_{bat})$$

In the equations above the phase of the voltage across $R_{conv}$ is defined as zero.

The voltage/current source can be either under the control of the measurement system e.g. a sine wave generator, or it can be outside direct control of the measurement system e.g. the drive current of the traction motor of an electric car. The first method can be used when the car is not moving. The second method can be used when the car is driven i.e. it is on the move. The first method has the advantage that the battery impedance can be measured at any desired frequency at any time. In the second method there is a chance that certain frequency components are not present in the current for some time.

The above-presented solution forces a current through battery pack and measures the voltage across the pack. However, in LiIon battery packs we would like to know the SoC and SoH of each individual cell. LiIon battery packs normally have a monitoring circuit connected to each cell. These circuits monitor the voltage and temperature of all cells and often contain additional circuits for so-called cell balancing: circuits to equalise the charge in all cells by either bleeding the fullest cells or moving charge from cells with a high charge to cells with a low charge.

As we want to measure the impedance of each individual cell we have to measure the voltage on each individual cell. The known solution drives a current through the whole battery pack, but if we want to measure the voltage of one cell we only have to drive current through that cell. The cell-balancing circuits can help with that. They have the ability to draw current from individual cells by switching a bleed resistor i.e. passive balancer or an inductor i.e. active balancer across the cell, as it is shown in FIG. 4. The switch of a resistive balancer, as shown in FIG. 4a, is closed continuously as long as the cell must be bled. The switch of an inductive balancer, as shown in FIG. 4b, is opened and closed with a high frequency in MHz range. Otherwise the current through the inductor would rise to unacceptably high levels.

It is the object of the present invention to provide a simplified measurement environment for the impedances of a cell battery.

1. This object is achieved in a battery cell measurement system comprising:

a signal generator coupled to a pulse density modulation circuit, the pulse density modulation circuit generating a control signal which drives a switch, the switch being connected between a first terminal of the battery cell and a first terminal of a bleeding impedance, a second terminal of the bleeding impedance being coupled to a second terminal of the battery cell;

the first terminal of the bleeding impedance being coupled to a first terminal of a second switch, the second terminal of the bleeding impedance being coupled to a first terminal of a third switch, a second terminal of the second switch and second terminal of the third switch being coupled to each other and further coupled to a low-pass filter, a signal generated by the low-pass filter being inputted into an analog to digital converter, the analog to digital converter providing a signal which is representative either for a signal across the bleeding impedance, or for a signal between the terminals of the battery cell.

Surprisingly, using the above arrangement the circuit arrangement for measuring the battery pack can be easily adapted to measure each cell of the battery. In an embodiment of the invention the battery cell measurement system further comprises a band-pass filter coupled to the analog to digital converter and further coupled to an amplitude/phase detector, the amplitude/phase detector and the signal generator being driven by a same signal.

Advantageously, in another embodiment of the invention the battery cell measurement system the analog to digital converter is an oversampled sigma/delta converter.

In another embodiment of the invention, the signal generator provides a sinusoidal output and comprises a look-up table.

Advantageously, the output signal of the analog to digital converter is coupled to a digital Fourier transform circuit.

BRIEF DESCRIPTION OF THE DRAWINGS

The above and other advantages will be apparent from the exemplary description of the accompanying drawings in which.

DETAILED DESCRIPTION OF EMBODIMENTS

Figure 5:
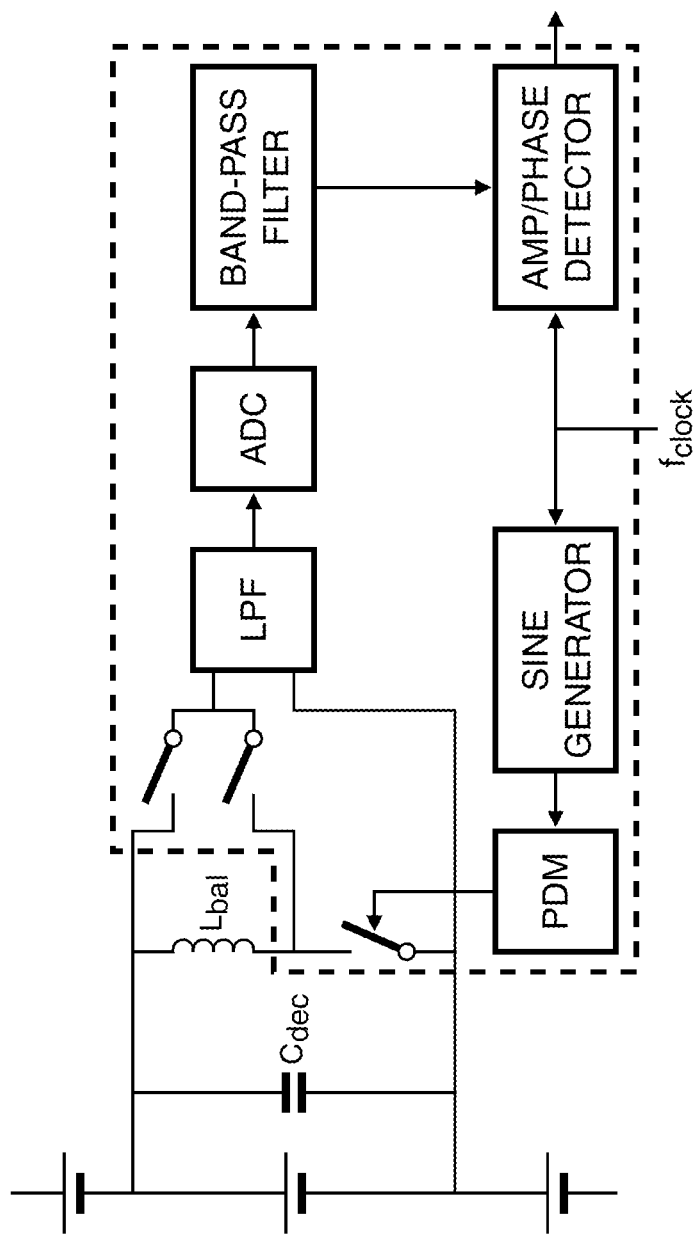
FIG. 5 depicts an impedance measurement system of a battery cell according to the invention.

The algorithm of the impedance measurement requires voltage/current measurements at various frequencies in the range from mHz to kHz. For both the resistive and the inductive case this can be achieved by driving the switch with e.g. a PWM (Pulse Width Modulation) signal or a PDM (Pulse Density Modulation) signal. Systems with both PWM and PDM signals can readily be made. However, in fully digital systems with a clock frequency that is designed to be as low as possible, which is important to keep the dissipation low, PDM may be the preferred solution. PWM requires parts of the circuit to respond in less than a clock cycle, whereas PDM only acts on the active clock edges. In FIG. 5, a digital sine wave signal is converted into a PDM signal that opens and closes a switch that connects to the inductor of the balancing circuit or the resistor of the balancing circuit in case of a resistive balancer. A multiplexed analog to digital converter (ADC) converts either the voltage across the switch or the voltage across the battery cell. There is no need to measure the voltage across the switch and the battery cell alternately. As the sine wave is generated internally we only have to measure it now and again to calibrate the measurement of the cell voltage. This is helpful in saving power as it means we can keep the ADC in standby mode for larger part of the time. The output of the amplitude/phase detector is sent to a microcontroller for further processing. If needed, the ADC's output signal is band-pass filtered before it enters the amplitude/phase detector. The impedance measurement can take place during the normal balancing process, when the battery is at rest. When the battery pack is perfectly balanced, the impedance can also be measured, albeit at the cost of some wasted energy. The wasted energy will be smallest if an inductive balancer is used as energy can be pumped between two cells while measuring the impedance.

Figure 1:
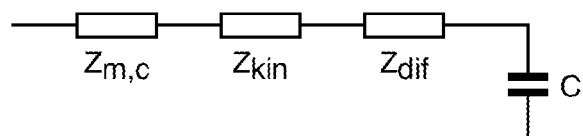
FIG. 1 depicts a simplified battery model.
Figure 2:
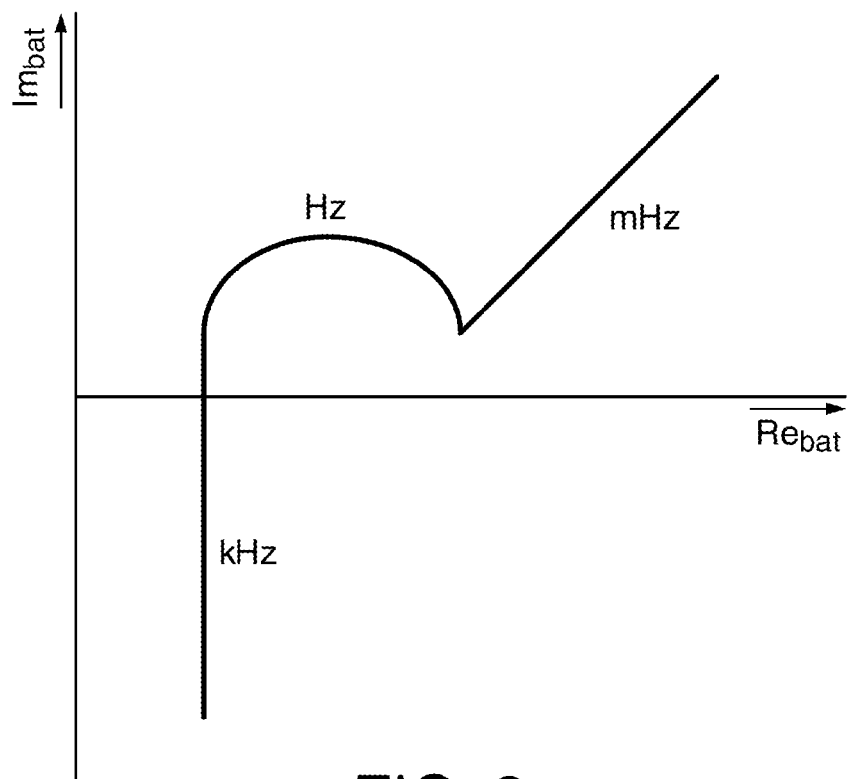
FIG. 2 depicts a simplified Nyquist plot of an impedance of a battery.
Figure 3:
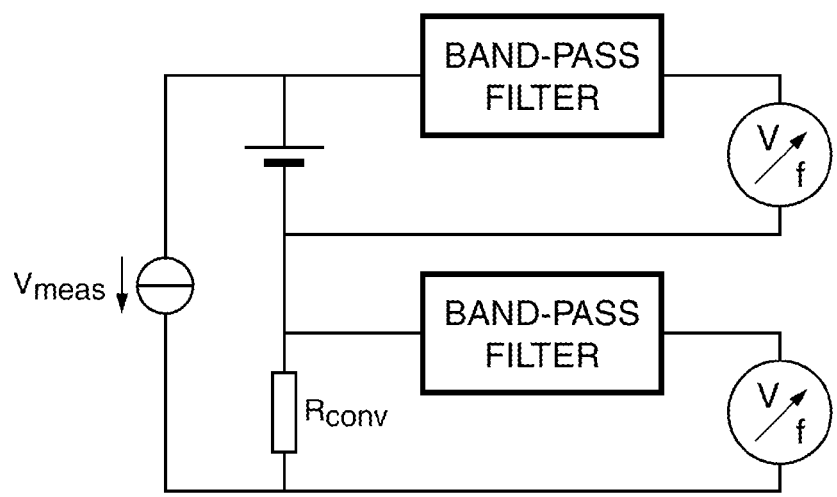
FIG. 3 depicts a basic impedance measurement circuit for a battery cell.
Figure 4:
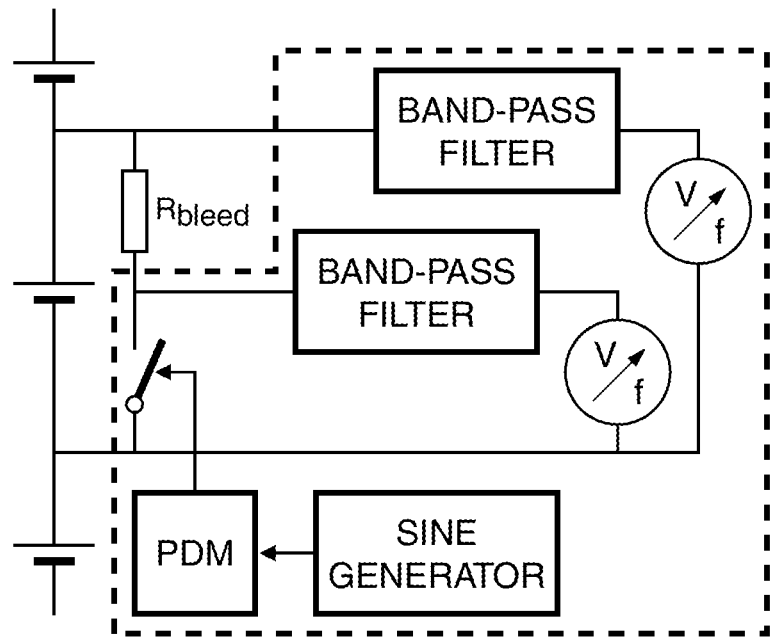
FIG. 4 depicts an impedance measurement circuit for a battery cell in a resistive balancer (FIG. 4a) and in an inductive balancer (FIG. 4b).
Figure 4:
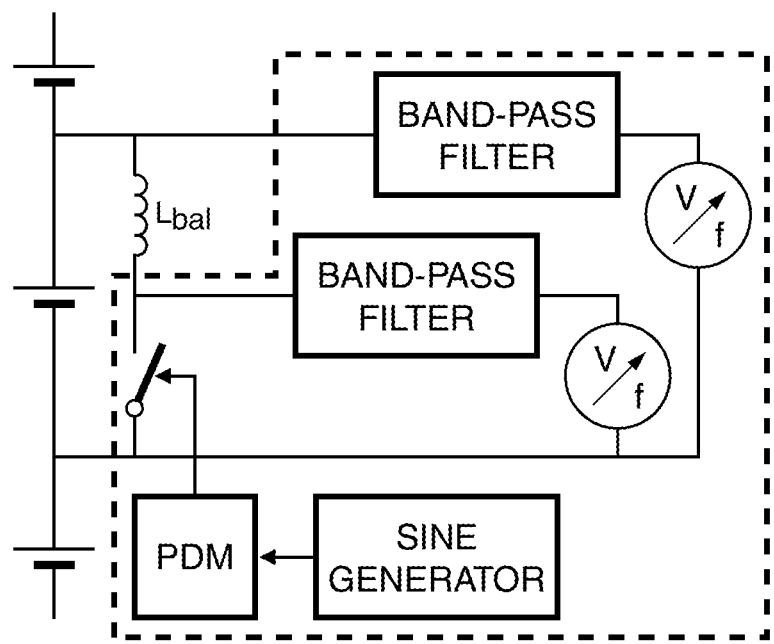

There is an important difference between the "resistive" and the "inductive" version of this measurement setup. In the resistive method the sine wave is modulating a bias current, in the inductive method the sine wave can have a zero bias point. A battery cell is a highly non-linear system, in which the non-linearities have time-constants of the order of ms and longer. As a consequence the measurement of the kinetic and diffusion part of the impedance curve will be less accurate in a resistive balancer than in an inductive balancer. Still, this does not mean this method is useless in a resistive balancing system. It can be used to measure $Z_{m,c}$. This impedance is usually the smallest of the impedances shown in FIG. 1. This means it is hardest to estimate with the traditional curve fitting method. As $Z_{m,c}$ is the most indicative impedance for the SoH, a direct measurement can help to spot degradation of the cells or e.g. corrosion of its contacts sooner than with the traditional method.

The frequencies we want to measure are low to very low, the linearity we require is very high, and the power consumption must be very low because we want to measure the properties of the battery without draining its energy. An oversampled sigma-delta converter with a chopping input stage can fulfil these requirements. An oversampling ADC has the advantage that the low-pass filter in front of the ADC only has to have a good suppression at the sampling frequency. A low-pass filter that suppresses MHz frequencies needs much smaller component than a filter that has to suppress kHz frequencies, so it can be integrated more easily.

When a battery cell is at rest it produces very little noise at low frequencies. It is therefore possible to turn the digital band-pass filter behind the ADC into a low-pass filter. The 1/f noise of the ADC itself is the biggest noise factor, but this can be moved to a high frequency band by giving the ADC a chopping input stage.

Using a square wave instead of a sine wave will make the circuit much simpler. However, the highly non-linear character of battery cells means it will be far harder to draw firm conclusions from the measurements.

The PDM sine contains lots of high-frequency components. To drive the cell with as pure a sine as possible it is wise to connect a decoupling capacitor as close to the IC as possible.

The impedance of a battery cell is very low. It is therefore important that the impedance of the wires between the battery cell and the measurement circuit are not included in the final outcome. The most accurate way to avoid this is to use four-wire voltage measurements, i.e. use two wires for the current going to the battery and two other wires to measure the voltage at the battery cell terminals. However, as this costs two extra wires and extra pins on the IC, it may be better to measure the impedance of the wires between the measurement circuit and the battery cell during the manufacturing of the battery pack. This value can subsequently be subtracted from the measurement results during run time. The wires normally are not subject to severe ageing effects, so only the effect of temperature change (one of the parameters that is measured anyway) may have to be accounted for. Additional advantage of a two-wire solution is that e.g. a broken wire or corroded contact can be detected more easily.

Figure 6:
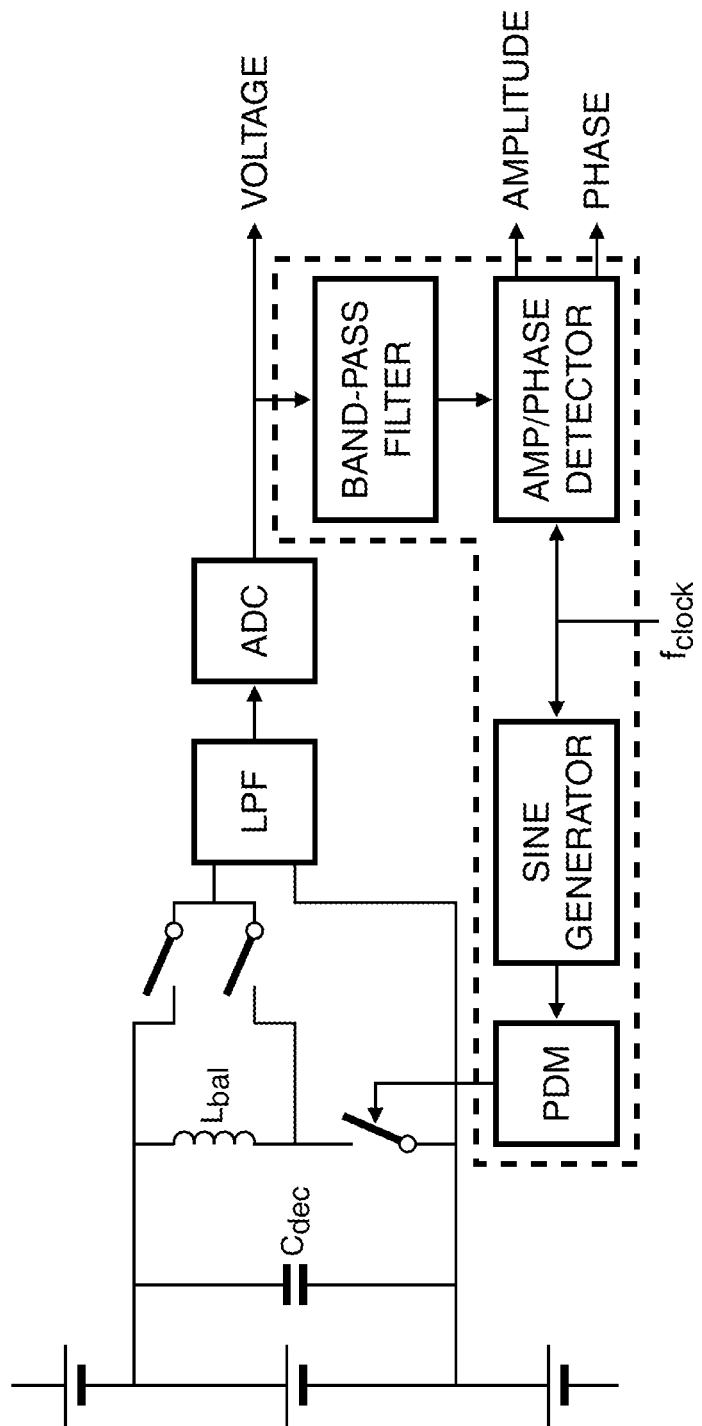
FIG. 6 depicts an embodiment of the invention.
Figure 7:
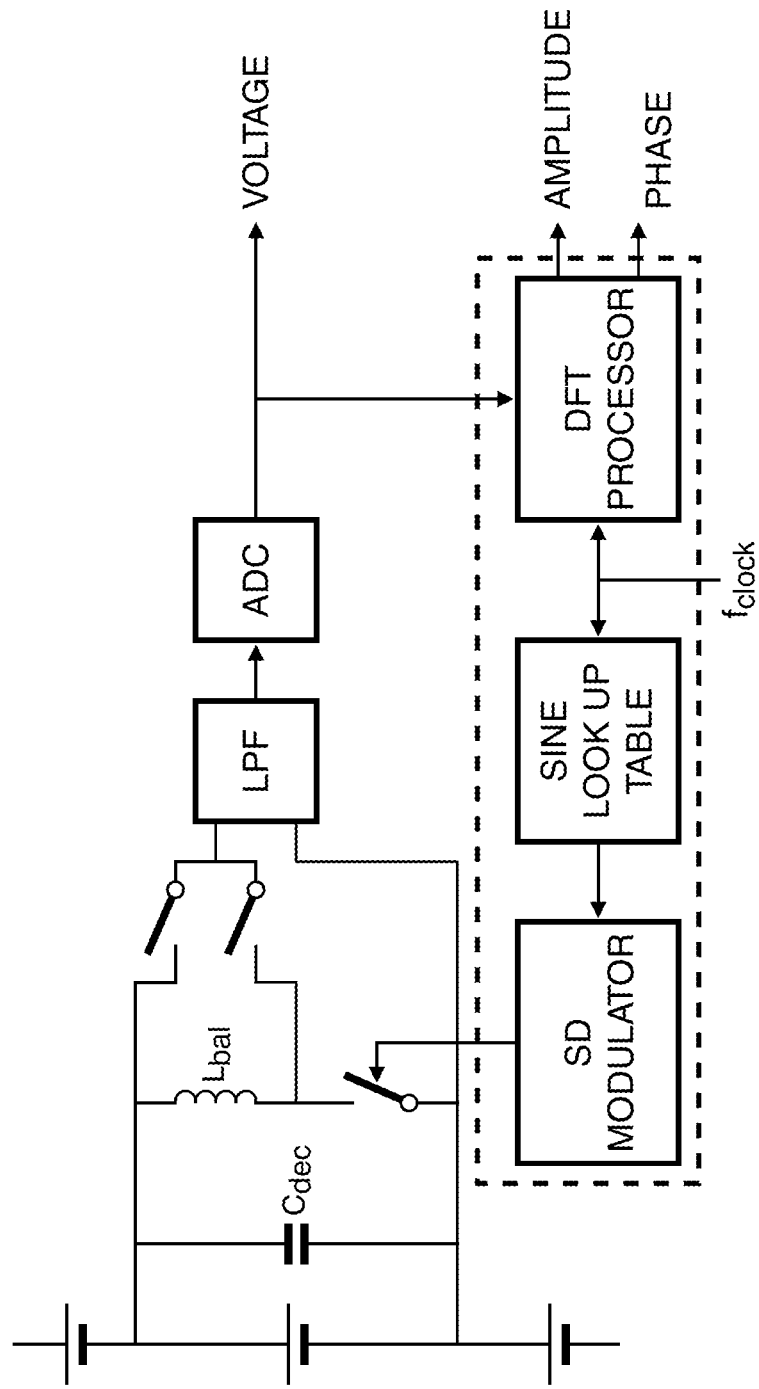
FIG. 7 depicts a further embodiment of the invention.
Figure 8:
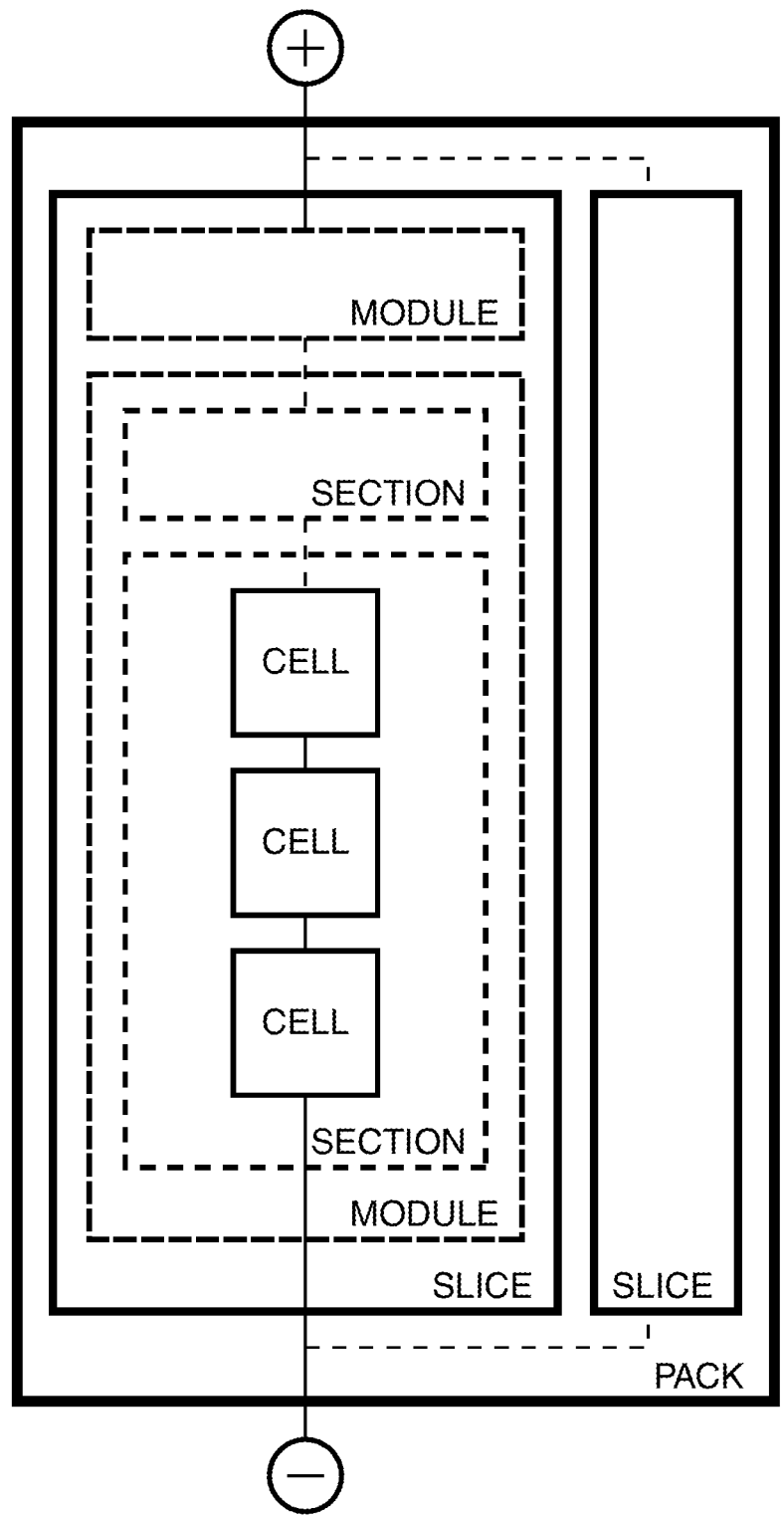
FIG. 8 illustrates the main concepts and definitions used in the application.

FIG. 6 depicts an embodiment of the invention. All circuit part in the green box can be implemented in several ways. FIG. 7 shows an implementation which requires very simple and small circuits. The sine generator can be a LUT i.e. lookup table circuit. The PDM can be realised as a digital sigma-delta modulator. The combination of the band-pass filter and amplitude/phase detector can be realised as a DFT (digital Fourier transform) circuit. A DFT circuit can usually be implemented with fewer components then the sum of the components in a band-pass filter and an amp/phase detector.

It is remarked that the scope of protection of the invention is not restricted to the embodiments described herein. Neither is the scope of protection of the invention restricted by the reference numerals in the claims. The word "comprising" does not exclude other parts than those mentioned in the claims. The word "a(n)" preceding an element does not exclude a plurality of those elements. Means forming part of the invention may both be implemented in the form of dedicated hardware or in the form of a programmed purpose processor. The invention resides in each new feature or combination of features.

The invention claimed is:

1. A battery cell measurement system comprising:
a signal generator coupled to a pulse density modulation circuit, the pulse density modulation circuit generating a control signal which drives a switch, the switch being connected between a first terminal of a battery cell and a first terminal of a bleeding impedance, a second terminal of the bleeding impedance being coupled to a second terminal of the battery cell;
the first terminal of the bleeding impedance being coupled to a first terminal of a second switch,
the second terminal of the bleeding impedance being coupled to a first terminal of a third switch,
a second terminal of the second switch and second terminal of the third switch being coupled to each other and further coupled to a low-pass filter,
a signal generated by the low-pass filter being inputted into an analog to digital converter, the analog to digital converter providing a signal which is representative either for one of a signal across the bleeding impedance, or a signal between the terminals of the battery cell.

2. A battery cell measurement system as claimed in claim 1, wherein the bleeding impedance is one of a resistor and an inductor.

3. A battery cell measurement system as claimed in claim 1 further comprising a band-pass filter coupled to the analog to digital converter and further coupled to an amplitude/phase detector, the amplitude/phase detector and the signal generator being driven by a same signal.

4. A battery cell measurement system as claimed in claim 1, wherein the analog to digital converter is an oversampled sigma/delta converter.

5. A battery cell measurement system as claimed in claim 1, wherein the signal generator provides a sinusoidal output and comprises a look-up table.

6. A battery cell measurement system as claimed in claim 1, wherein the output of the analog to digital converter is coupled to a digital Fourier transform circuit.

* * * * *